United States Patent
Lee

(10) Patent No.: US 9,661,760 B2
(45) Date of Patent: May 23, 2017

(54) PRINTED CIRCUIT BOARD AND MANUFACTURING METHOD THEREOF

(71) Applicant: BOARDTEK ELECTRONICS CORPORATION, Taoyuan (TW)

(72) Inventor: Chien-Cheng Lee, Taoyuan (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 0 days.

(21) Appl. No.: 14/845,597

(22) Filed: Sep. 4, 2015

(65) Prior Publication Data

US 2015/0382472 A1    Dec. 31, 2015

Related U.S. Application Data

(63) Continuation-in-part of application No. 13/671,742, filed on Nov. 8, 2012, now abandoned.

(51) Int. Cl.
| | |
|---|---|
| H05K 3/02 | (2006.01) |
| H05K 3/46 | (2006.01) |
| H05K 1/02 | (2006.01) |
| H05K 3/06 | (2006.01) |
| H05K 3/10 | (2006.01) |
| H05K 3/42 | (2006.01) |

(52) U.S. Cl.
CPC ......... *H05K 3/4611* (2013.01); *H05K 1/0265* (2013.01); *H05K 3/022* (2013.01); *H05K 3/06* (2013.01); *H05K 3/10* (2013.01); *H05K 3/427* (2013.01); *H05K 3/429* (2013.01); *H05K 2201/09736* (2013.01); *H05K 2203/0723* (2013.01); *H05K 2203/1476* (2013.01); *Y10T 29/49155* (2015.01)

(58) Field of Classification Search
CPC ........ H05K 3/4611; H05K 3/022; H05K 3/06; H05K 3/10; H05K 3/427; H05K 3/429; H05K 2203/0723; H05K 2203/1476; H05K 2201/09736; H05K 1/0265; Y10T 29/49156; Y10T 29/49124; Y10T 29/49117; Y10T 29/49002
USPC ................................ 29/846, 829, 825, 592.1
See application file for complete search history.

(56) References Cited

U.S. PATENT DOCUMENTS

| | | | |
|---|---|---|---|
| 2009/0001550 A1* | 1/2009 | Li | H05K 3/422 257/700 |
| 2012/0112277 A1* | 5/2012 | Denison | H01L 21/823814 257/337 |
| 2012/0155854 A1* | 6/2012 | Huang | G03B 17/02 396/535 |

* cited by examiner

*Primary Examiner* — Peter DungBa Vo
*Assistant Examiner* — Azm Parvez
(74) *Attorney, Agent, or Firm* — Li & Cai Intellectual Property (USA) Office

(57) ABSTRACT

A printed circuit board includes a first substrate, two first circuits formed on a surface of the first substrate, and a thick copper circuit. The thickness of each first circuit is smaller than the thickness of the first substrate, and the first substrate and one of the first circuits cooperatively define a circuit trench. The thick copper circuit is arranged in the circuit trench and is integrally connected to the first circuit, which is corresponding to the groove. The thick copper circuit and the connected first circuit are defined as a thick circuit, and another first circuit is defined as a thin circuit. The length of the thick copper circuit connected to the corresponding first circuit is identical to or greater than 10% of the length of the thick circuit. Additionally, the instant disclosure also provides a method for manufacturing a printed circuit board.

7 Claims, 17 Drawing Sheets

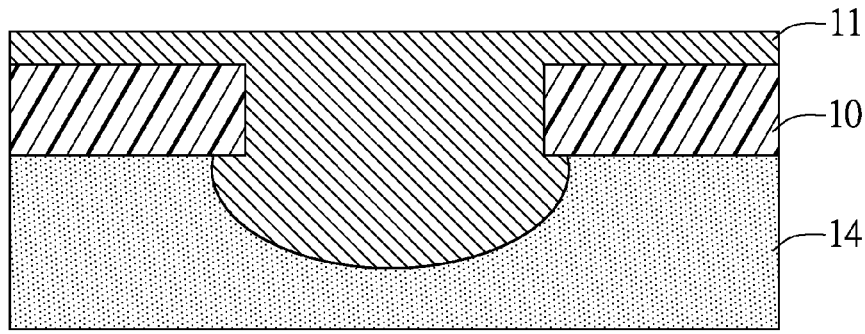
FIG.7A
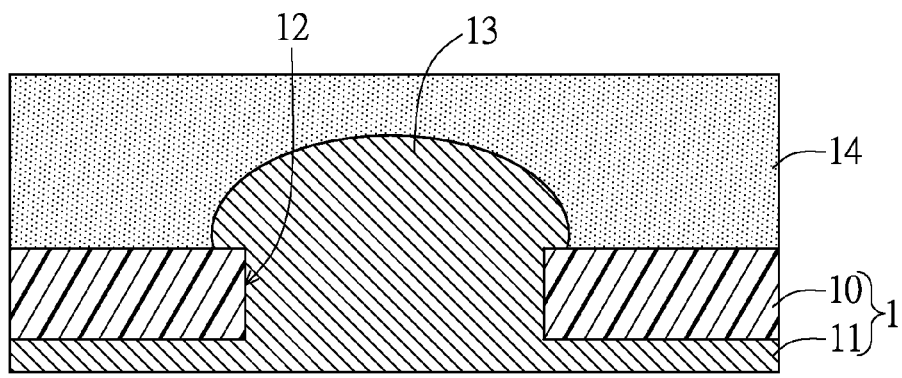
FIG.7B
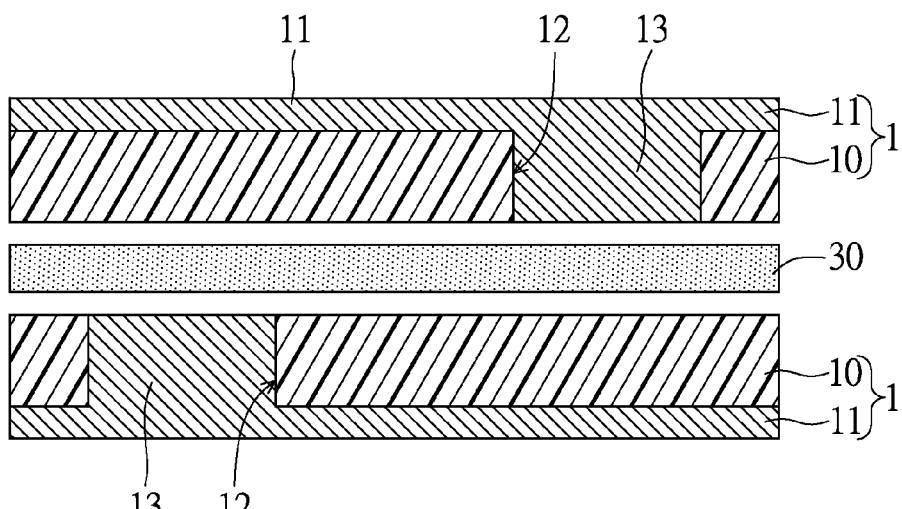

PRINTED CIRCUIT BOARD AND MANUFACTURING METHOD THEREOF

This is the Continuation-in-part of U.S. patent application Ser. No. 13/671,742, filed on Nov. 8, 2012, currently pending.

FIELD OF THE INVENTION

The present invention relates to a circuit manufacturing technology for printed circuit boards, and more particularly to the printed circuit board manufacturing method applicable for manufacturing at least one thin circuit and at least one large cross-section circuit on a same PCB substrate.

DESCRIPTION OF RELATED ART

A printed circuit board (PCB) generally uses a circuit layer (or a copper film) for transmitting electric signals which plays the role of connecting circuits between electronic components, integrating the circuits on a plane and distributing the circuits on a board surface or a three-dimensional circuit layer of the printed circuit board to constitute a network for connecting components at different positions.

In general, most basic materials (hereinafter referred to as "substrates" of a printed circuit board are laminates formed by stacking and laminating an insulating paper, a fiberglass fabric or any other fiber material with a prepreg which is soaked with a resin, and added with a copper film on a single side or both sides of the printed circuit board at high temperature and pressure. As to the conductor that constitutes each circuit layer of the printed circuit board, a copper plating guide hole is provided for achieving the effect.

As the material and manufacturing technologies advance rapidly, the performance of the printed circuit board becomes relatively more reliable, thus the printed circuit board can be used extensively in different areas or even becomes one of the necessary key components. For example, the printed circuit board is applied more and more in spotlighted electric vehicles for related circuit layout design that integrates control signals and driving current, and the key technology mainly manufactures circuits of different thicknesses on a substrate of a printed circuit board for transmitting the control signals by using the circuit with relatively smaller thickness and transmitting high-power driving current by the circuit with relatively greater thickness in order to reduce the impedance of the driving current and avoid overheating of the printed circuit board that may influence the low-temperature operation performance.

In the conventional manufacturing technology for manufacturing circuits of two different thicknesses on a PCB substrate, a PCB substrate having a copper clad on a surface of the PCB substrate is adopted, wherein the height of the copper clad must be greater than the maximum thickness of the circuit thickness, and after the circuit etching operation of the copper clad formed on the surface of the PCB substrate is completed, the portion of the copper clad not required on the circuit is removed to obtain circuits of different thickness.

However, the aforementioned manufacturing method is simply called the "addition and subtraction manufacturing technology" in the industry, and the manufacturing process for producing different heights not only wastes a large quantity of high priced metals, but also requires repeated executions of wet process that consumes much more energy and generates pollution. Particularly, the circuits of different thickness have a significant height difference at the surface of the printed circuit board which may affect the manufacturing effect of the later surface treatment or even result in a dislocation of the components and low manufacturing quality.

SUMMARY OF THE INVENTION

In view of the aforementioned drawbacks of the prior art, the present invention provides a printed circuit board manufacturing method capable of manufacturing at least one thin circuit and at least one large cross-section circuit on a same PCB substrate by a lower material cost, and particularly capable of hiding the large cross-section circuit in a printed circuit board.

To achieve the aforementioned objective, the present invention provides a manufacturing method of a printed circuit board, comprising: providing a board, wherein the board includes a first PCB substrate and a copper clad circuit layer, the first PCB substrate has a first board surface and an opposite second board surface, the copper clad circuit layer is disposed on the first board surface, and a thickness of the copper clad circuit layer is smaller than a distance between the first and second board surfaces; non-chemically etching the second board surface of the first PCB substrate to form an elongated circuit trench until part of the copper clad circuit layer is exposed from the second board via the circuit trench; forming a thick copper circuit in the circuit trench by a plating manner, a thickness of the thick copper circuit being greater than or identical to the distance between the first and second board surfaces; and etching the copper clad circuit layer to form two separated first circuits, wherein the thick copper circuit and one of the first circuits are in an integral connection and are defined as a thick circuit, and another one of the first circuits is defined as a thin circuit, wherein a length of the thick copper circuit connected to the corresponding first circuit is at least 10% of a length of the thick circuit.

The present invention also provides a manufacturing method of a printed circuit board, comprising: providing a board, wherein the board includes a first PCB substrate and two copper clad circuit layers, the first PCB substrate has a first board surface and an opposite second board surface, the copper clad circuit layers are respectively disposed on the first and second board surfaces, and a thickness of each copper clad circuit layer is smaller than a distance between the first and second board surfaces; forming an elongated opening on the copper clad circuit layer disposed on the second board surface; non-chemically etching a portion of the second board surface of the first PCB substrate exposed from the corresponding copper clad circuit layer via the opening to form an elongated circuit trench until part of the copper clad circuit layer disposed on the first board surface is exposed from the second board surface via the circuit trench, wherein a width of the circuit trench is smaller than a width of the opening, a region between a wall defining the opening and a side wall of the circuit trench is defined as a first reserved region; forming two shielding layers onto the two copper clad circuit layers and the first reserved region to expose the circuit trench; forming a thick copper circuit in the circuit trench by a plating manner, a thickness of the thick copper circuit being greater than or identical to the distance between the first and second board surfaces; removing the two shielding layers; and etching the copper clad circuit layer arranged on the first board surface to form two separated first circuits, wherein the thick copper circuit and one of the first circuits are in an integral connection and are defined as a thick circuit, and another one of the first circuits is defined as a thin circuit, wherein a length of the thick copper circuit connected to the corresponding first circuit is at least 10% of a length of the thick circuit.

The present invention further provides a printed circuit board, comprising: a first PCB substrate having a first board surface and an opposite second board surface; two first circuits disposed on the first board surface, wherein a thickness of each first circuit is smaller than a distance between the first and second board surfaces, the first PCB substrate and one of the first circuits surroundingly define a circuit trench; and a thick copper circuit arranged in the circuit trench and integrally connected to the first circuit corresponding to the circuit trench; wherein the thick copper circuit and the connected first circuit are defined as a thick circuit, the first circuit non-connected to the thick copper circuit is defined as a thin circuit, wherein a length of the thick copper circuit connected to the corresponding first circuit is at least 10% of a length of the thick circuit.

More specifically, the printed circuit board and the manufacturing method thereof in the present invention has the following advantages:

1. In the first PCB substrate of the basic structure of the circuit with the copper clad circuit layer of a smaller thickness, at least one circuit with a thickness greater than that of the copper clad circuit layer is manufactured to save the material costs.

2. The addition manufacturing technology is applied to build the circuit having a circuit with a thickness greater than that of the copper clad circuit layer on the first PCB substrate, so as to avoid wasting the high priced metal effectively.

3. In the addition manufacturing technology is applied to build the circuit having a circuit with a thickness greater than that of the copper clad circuit layer on the first PCB substrate, the manufacture does not require repeated etching operations, so that the pollution sources can be minimized.

4. Since the large cross-section circuit is hidden inside the printed circuit board, therefore when a multiple of layers are laminated, the process no longer requires a large quantity of filling of the prepreg, so that the issues of sliding boards or bubbles caused by excessive or insufficient flow will not occur easily during the lamination process, or a large quantity of resin flows into the gaps of the thick copper to give rise to the issues of reliability or conductive anodic filament (CAF) caused by the direct contact of the copper clad layer.

5. Since the large cross-section circuit is hidden inside the printed circuit board, therefore the problem of having a height difference will not be so serious, that may make it difficult to cover a solder mask or print texts.

6. The instant disclosure takes the shielding layers to cover the copper clad circuit layers and the first and second reserved regions, thereby preventing metallic ions from gathering at edges of the copper clad circuit layers. Accordingly, the thick copper circuits can be prepared by using the plating manner without forming any copper nodule.

BRIEF DESCRIPTION OF THE DRAWINGS

FIG. 7A is a schematic view of stacking and laminating a plurality of first PCB substrates of the present invention;

FIG. 7B is a schematic view of stacking and laminating a plurality of first PCB substrates shown in FIG. 4E of the present invention;

DETAILED DESCRIPTION OF THE PREFERRED EMBODIMENTS

The technical contents and characteristics of the present invention will be apparent with the detailed description of a preferred embodiment accompanied with related drawings as follows.

Figure 1:
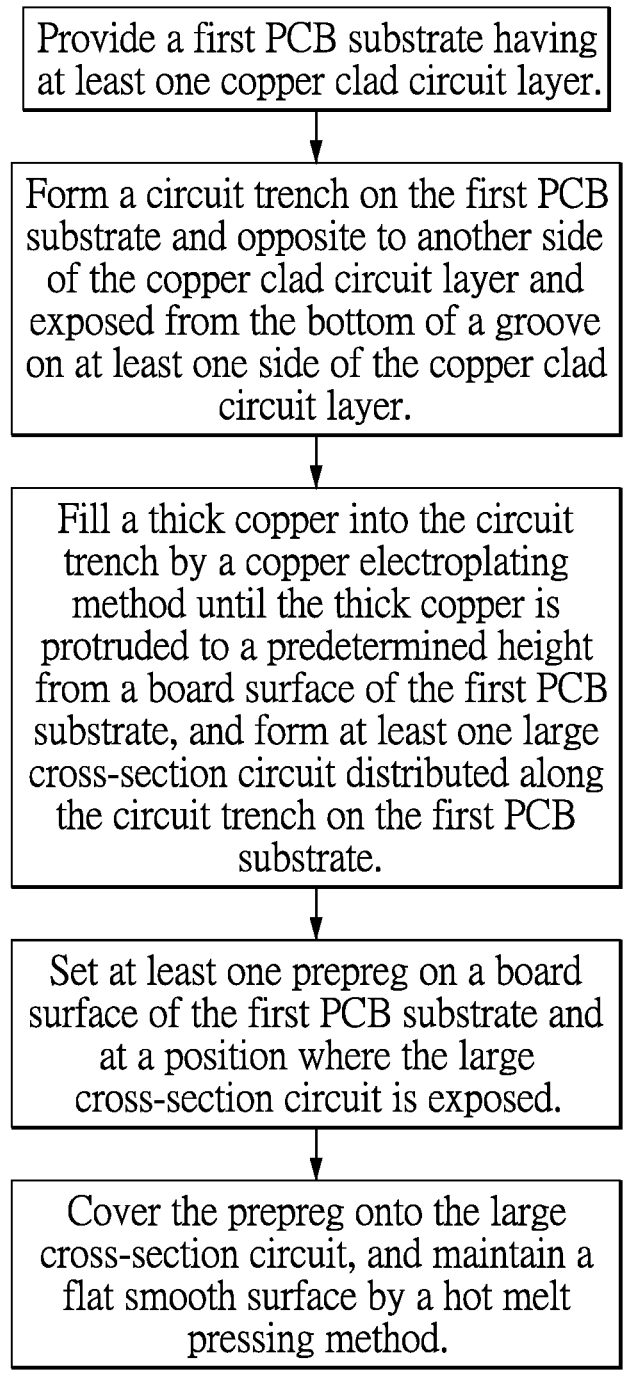
FIG. 1 is a basic flow chart of a first embodiment of the present invention.
Figure 2A:
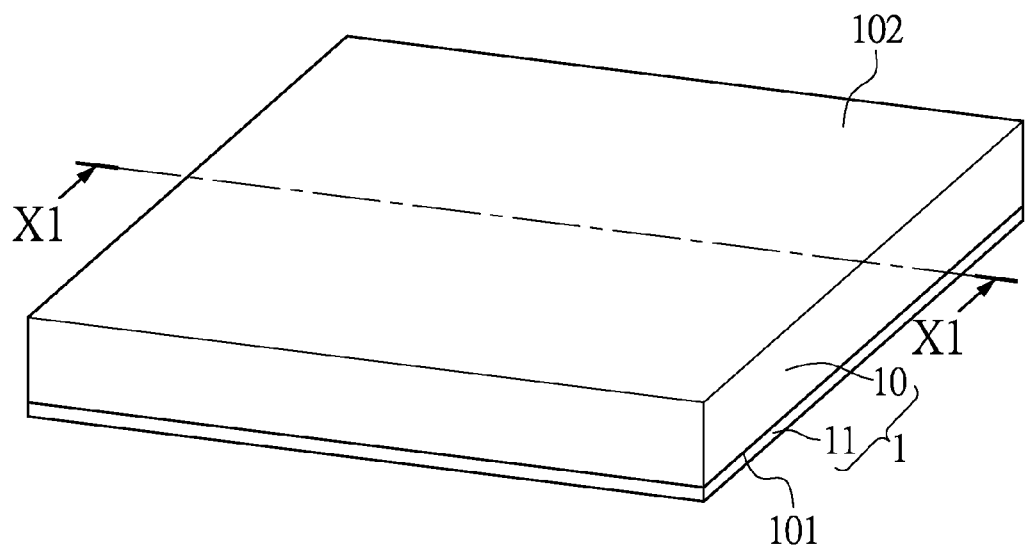
FIG. 2A is a perspective view of a first PCB substrate of the first preferred embodiment of the present invention.
Figure 2B:
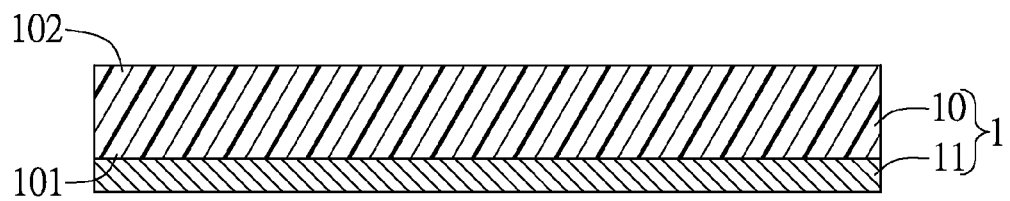
FIG. 2B is a cross-sectional view of the first PCB substrate shown in FIG. 2A of the first preferred embodiment of the present invention.

With reference to FIG. 1 for the flow chart of the present invention, the printed circuit board manufacturing method of the present invention comprises the following steps:

(a) A board 1 as shown in FIG. 2A and FIG. 2B is provided, the board 1 includes a first PCB substrate 10 and at least one copper clad circuit layer 11. The substrate 1 has a copper clad circuit layer 11 on one of the board surfaces of the first PCB substrate 10 or two copper clad layers 11 on two board surfaces of the first PCB substrate 10 respectively.

Specifically, the first PCB substrate 10 is generally formed of pre-impregnated material, and the pre-impregnated material can be glass fiber prepreg, carbon fiber prepreg, or epoxy resin. The first PCB substrate 10 can be formed by soft material (e.g., PET or PI) without any glass fiber or carbon fiber. But, the material of the first PCB substrate 10 is not limited to the instant embodiment.

Moreover, the weight of the copper clad circuit layer 11 is preferably less than 2 ounces, in other words, the thickness of the copper clad circuit layer 11 is preferably less than 70 μm. The thickness of the board 1 is preferably about 140~700 μm. However, the copper clad circuit layer 11 and the board 1 are not limited to the above description.

Figure 3A:
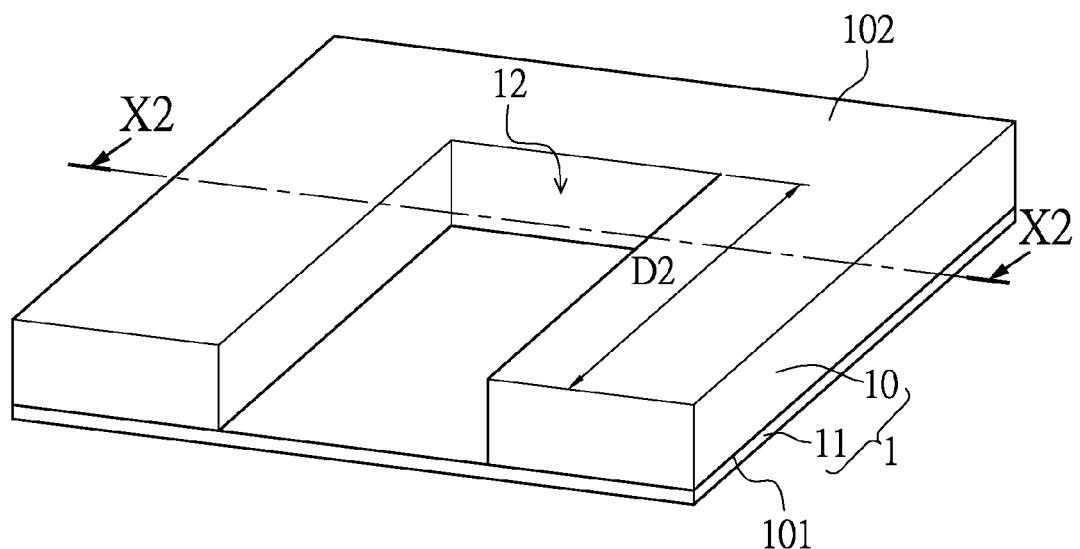
FIG. 3A is a perspective view of a circuit trench formed on a board surface of a first PCB substrate of the present invention.
Figure 3B:
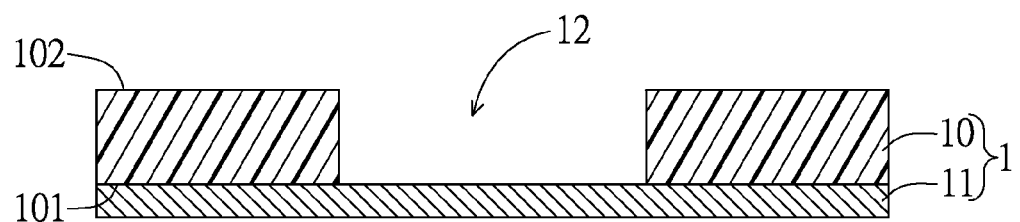
FIG. 3B is a cross-sectional view of the circuit trench formed on the board surface of the first PCB substrate shown in FIG. 3A of the present invention.

(b) As shown in FIG. 3A and FIG. 3B, at least one elongated circuit trench 12 is formed on the other side of the first PCB substrate 10 opposite to the copper clad circuit layer 11 (wherein the first PCB substrate 10 is disposed on another opposite side of the copper clad circuit layer 11 as shown in the figure), and part of the copper clad circuit layer 11 exposes from the elongated circuit trench 12. That is to say, the exposed portion of the copper clad circuit layer 11 is the bottom portion of the circuit trench 12. The length of the circuit trench 12 is greater than the depth of the circuit trench 12, the length of the circuit trench 12 is substantially identical to D2 as shown in FIG. 3A, and the depth of the circuit trench 12 is substantially identical to the thickness of the first PCB substrate 10.

Figure 4A:
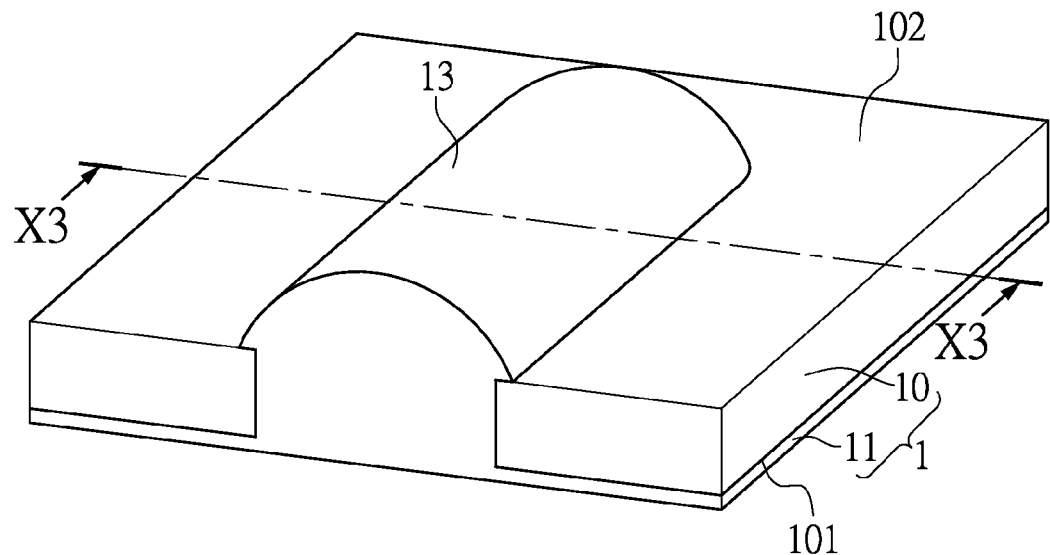
FIG. 4A is a perspective view of a thick copper filled and plated into a circuit trench of a first PCB substrate of the present invention.
Figure 4B:
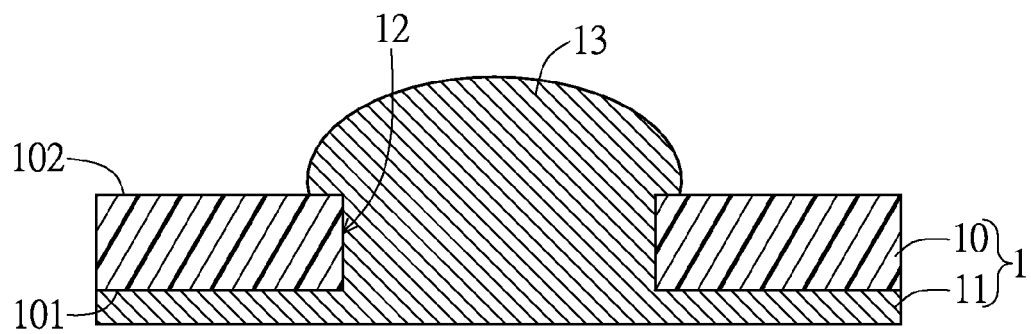
FIG. 4B is a cross-sectional view of the thick copper filled and plated into the circuit trench of the first PCB substrate shown in FIG. 4A of the present invention.

(c) As shown in FIG. 4A and FIG. 4B, a thick copper circuit 13 is filled into the circuit trench 12 by a copper electroplating method until the thick copper circuit 13 is protruded from a board surface of the first PCB substrate 10 with a predetermined height, thereby forming at least one large cross-section circuit embedded in the first PCB substrate 10 and distributed along the circuit trench 12.

Figure 4C:
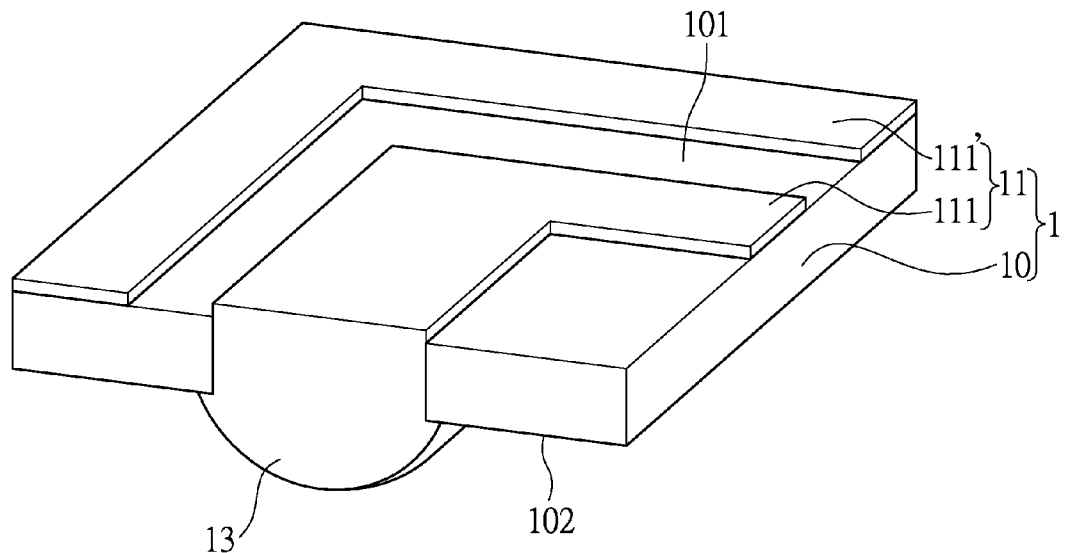
FIG. 4C is a perspective view showing the copper clad circuit layer of FIG. 4A being formed with a first circuit.
Figure 4D:
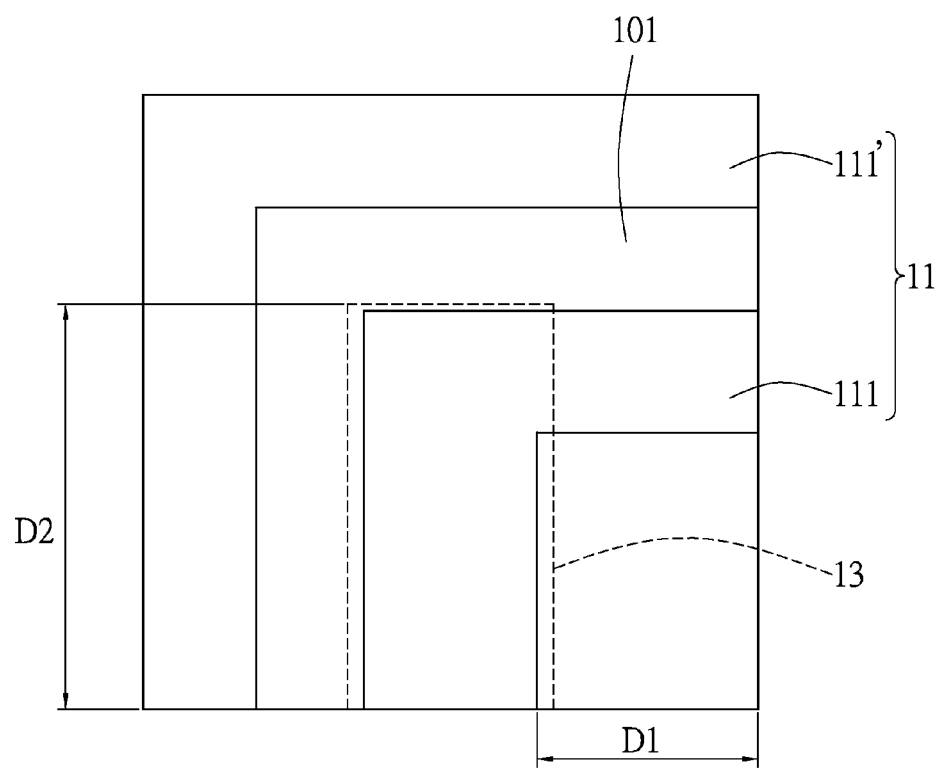
FIG. 4D is a top view of FIG. 4C.
Figure 4E:
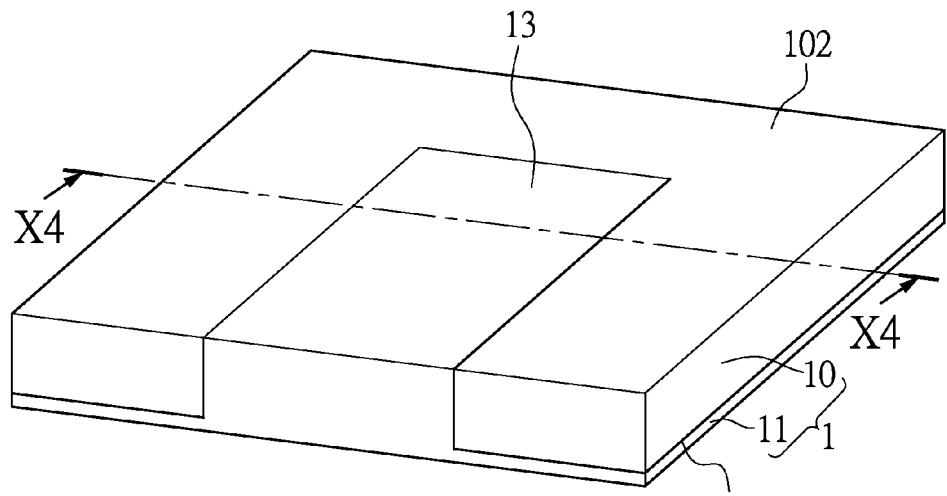
FIG. 4E is a perspective view showing a thick copper circuit entirely embedded in the circuit trench of the first PCB substrate.
Figure 4F:
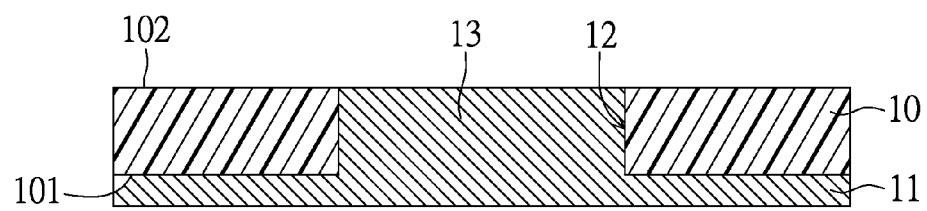
FIG. 4F is a cross-sectional view of FIG. 4E along line X4-X4.

In addition, the implementing manner of step (c) can be shown as FIG. 4E and FIG. 4F. The thick copper circuit 13 is filled into the circuit trench 12 by a copper electroplating method until the thick copper circuit 13 is coplanar with the second board surface 102 of the first PCB substrate 10, thereby forming at least one large cross-section circuit embedded in the first PCB substrate 10 and distributed along the circuit trench 12. Moreover, when the implementing manner of step (c) is adapted as FIG. 4E and FIG. 4F, the following steps (d) and (e) do not need to be implemented because of the second board surface 102 of the first PCB substrate 10 being coplanar with the adjacent end surface of the thick copper circuit 13.

Figure 5:
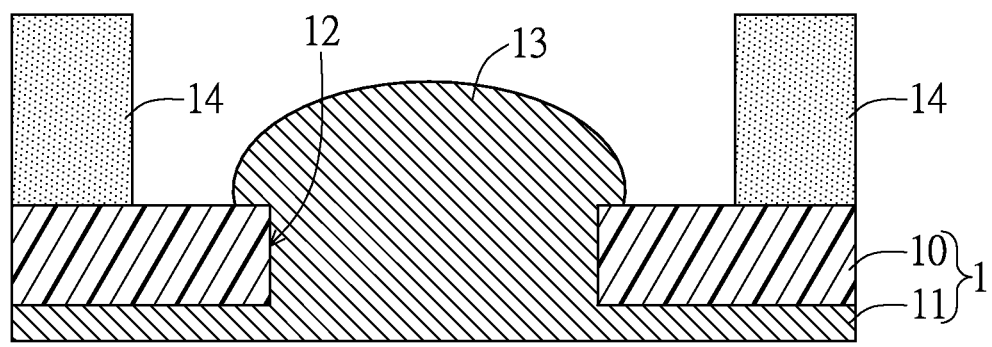
FIG. 5 is a schematic view of a prepreg formed on a first PCB substrate of the present invention.

(d) At least one prepreg 14 is disposed on a board surface of the first PCB substrate 10 and at a position where the large cross-section circuit is exposed as shown in FIG. 5.

Figure 6:
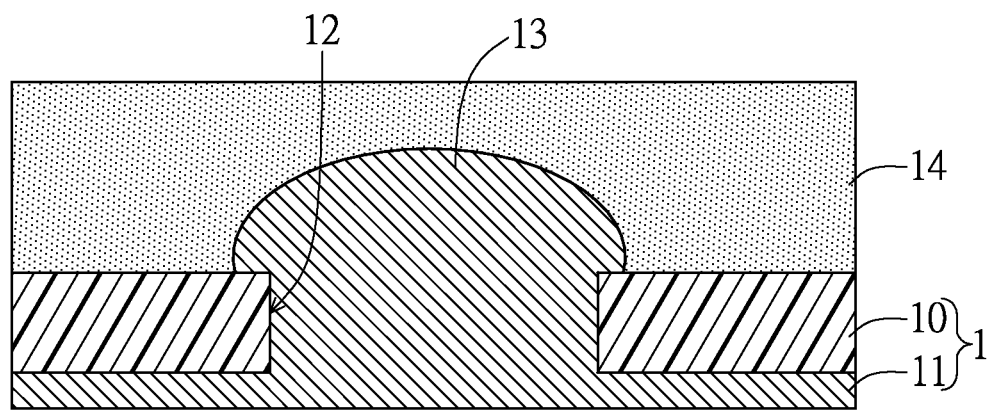
FIG. 6 is a cross-sectional view of a prepreg disposed on a board surface of a first PCB substrate and laminated and cured in accordance with the present invention.

(e) The prepreg 14 covers the large cross-section circuit by a hot melt pressing method, and maintains a flat smooth surface as shown in FIG. 6. Wherein, a PCB obtained from the aforementioned steps and cooled and shaped has at least one thin circuit comprised of the copper clad circuit layer 11 and has at least one large cross-section circuit comprised of the thick copper circuit 13 filled into the circuit trench 12 on the same first PCB substrate 10.

In the foregoing preferred embodiment, a prepreg 14 is installed on a board surface of the first PCB substrate 10 where the large cross-section circuit is exposed and disposed around both sides of the large cross-section circuit, so that the hot melted prepreg 14 can be covered onto the large cross-section circuit during a hot melt pressing process, and the cooled and cured prepreg 14 becomes the board body of the PCB 100, so as to achieve the effect of hiding the large cross-section circuit inside the board 1.

In addition of installing a prepreg 14 on a board surface of the first PCB substrate 10 where the large cross-section circuit is exposed and disposed around both sides of the large cross-section circuit, at least one layer of the prepreg 14 can be added and covered onto the board surface of the first PCB substrate 10 to achieve the effect of adjusting the thickness of the PCB 100, or at least one layer of prepreg 14 can be added to laminate a first PCB substrate 10 with another first PCB substrate, or laminate a second PCB substrate 20 having at least one copper clad circuit layer 21, so as to produce a multilayer PCB.

Figure 4G:
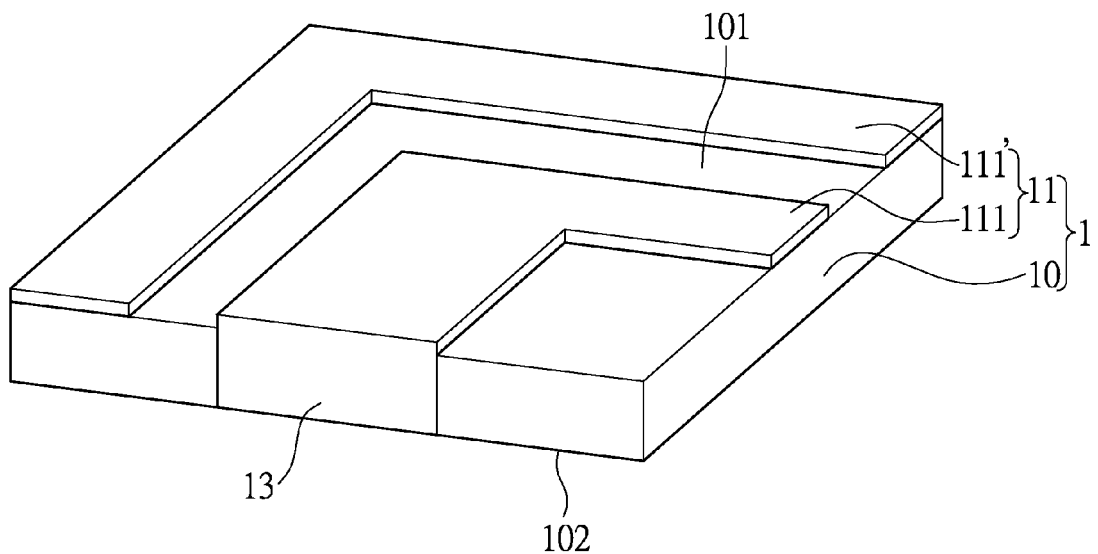
FIG. 4G is a perspective view showing the copper clad circuit layer of FIG. 4E being formed with a first circuit.

Specifically, after the thick copper circuit 13 is formed (as shown in the FIGS. 4A and 4B or FIGS. 4E and 4F), the copper clad circuit layer 11 can be etched to form two separated first circuits 111, 111' (as shown in FIG. 4C or FIG. 4G), and the first circuit 111 is integrally connected to the thick copper circuit 13. Thus, the first circuit 111 and the thick copper circuit 13 define a thick circuit, and another first circuit 111' defines a thin circuit. As shown in FIG. 4D, the total length of the thick circuit is substantially D1+D2, and the length of the thick copper circuit 13 is D2, which is at least 10% of the total length of the thick circuit (i.e., D1+D2). That is to say, the length of the thick copper circuit 13 is greater than the thickness of the thick copper circuit 13 (or the thickness of the first PCB substrate 10), and a length of part of the first circuit 111 connected to the thick copper circuit 13 is at least 10% of the total length of the thick circuit (or the length of the first circuit 111), thus at least 10% of the thick circuit has a large thickness, which is identical to the thickness of the first PCB substrate 10 and the copper clad circuit layer 11. In addition, the length of part of the first circuit 111 connected to the thick copper circuit 13 is preferably 10~40% of the total length of the thick circuit, but is not limited thereto.

Basically, the printed circuit board 100 obtained from the aforementioned steps (a) to (e) in accordance with the printed circuit board manufacturing method of the present invention can have circuits with at least two different thicknesses (or cross-sectional areas) on the same PCB substrate. In an application, the circuit with a smaller thickness (which is the circuit comprised of the first circuit 111') is used for transmitting control signals (or digital control signals) and the large cross-section circuit (which is comprised of the thick copper circuit 13 and part of the first circuit 111 connected to the thick copper circuit 13) for transmitting a high-power driving current, so as to achieve the effect of reducing the impedance of the driving current, avoiding burning or damage of the circuit, or overheating the printed circuit board, that may influence the low-temperature operation performance.

In the use of the printed circuit board 100 manufactured by the present invention, the large cross-section circuit (i.e., the thick circuit) is used as a waste heat emission channel of the circuit board, so that the circuit board always maintains its low-temperature operation performance. Particularly, the present invention with the aforementioned technical characteristics can manufacture at least one circuit with a thickness greater than that of the copper clad circuit layer 11 on the first PCB substrate 10 in the basic structure of the copper clad circuit layer 11 with a smaller thickness, so as to achieve the effects of saving material costs, avoiding a waste of high priced metals, and reducing pollution sources.

Figure 8A:
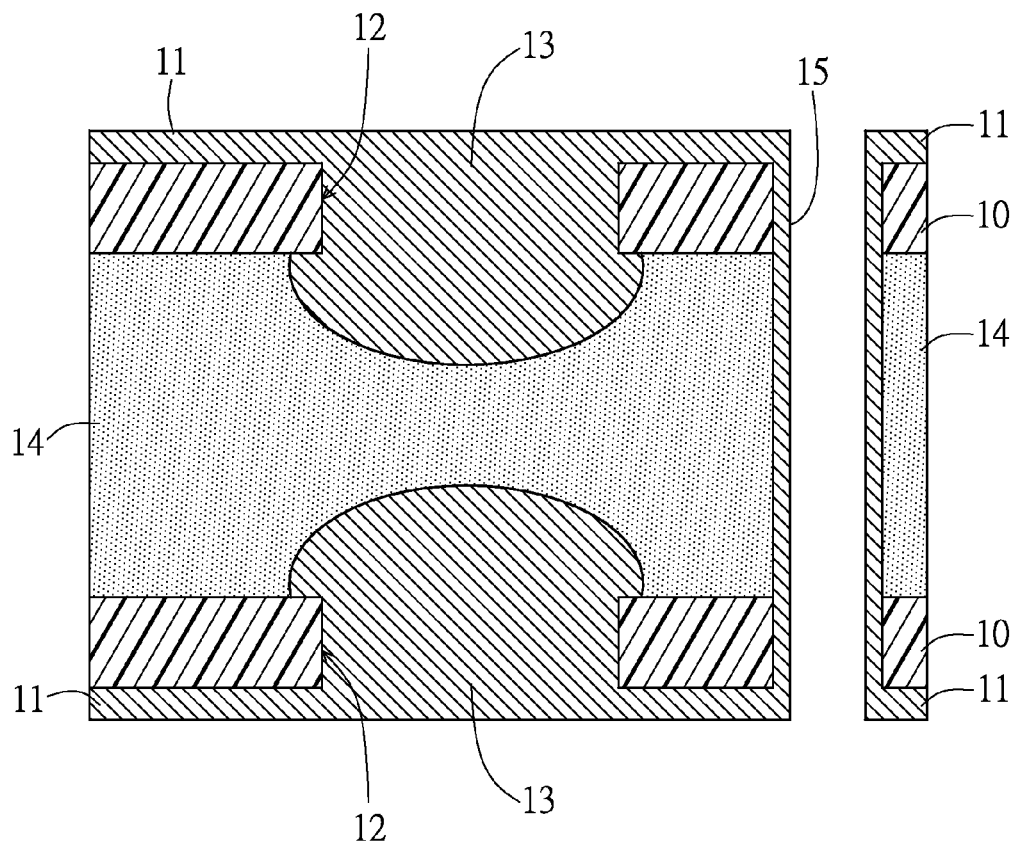
FIG. 8A is a cross-sectional view of a plurality of stacked and laminated first PCB substrates of the present invention.
Figure 8B:
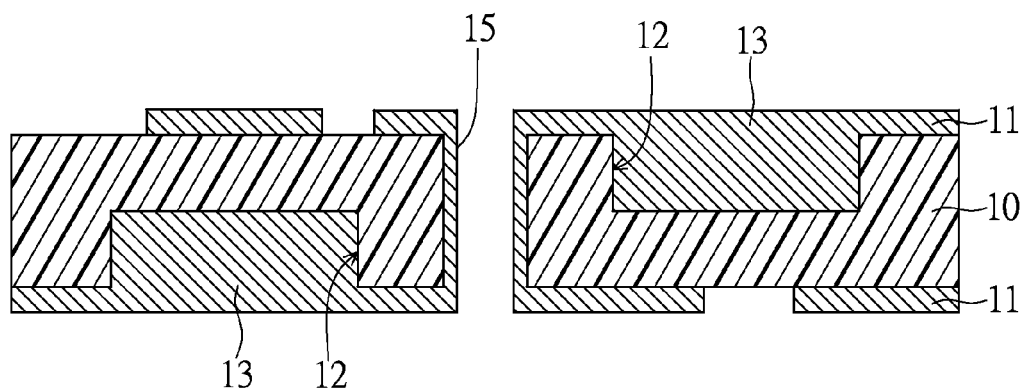
FIG. 8B is a cross-sectional view of a plurality of stacked and laminated first PCB substrates shown in FIG. 4G of the present invention.

In addition, the present invention provides a multilayer printed circuit board as shown in FIG. 7A or FIG. 7B, wherein at least two first PCB substrates 10 are stacked and laminated (wherein the prepreg 30 as shown in the figure is formed by stacking and laminating the plurality of first PCB substrates 10). In FIG. 8A or FIG. 8B, at least one conductor 15 is installed between the first PCB substrates 10 and provided for connecting predetermined circuits to provide a multi-layer circuit board and similarly achieve the effect of increasing the circuit layout density.

Figure 9:
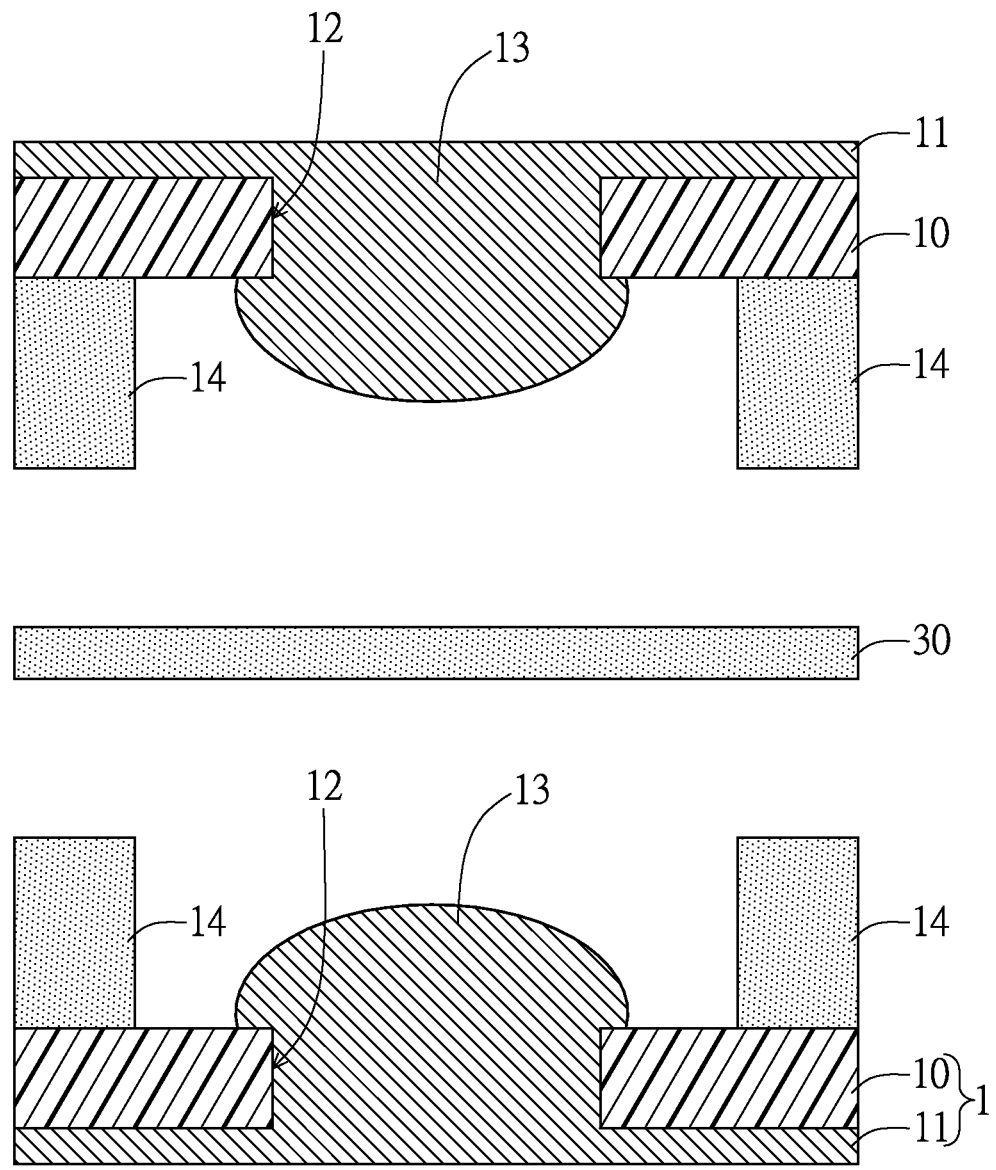
FIG. 9 is a schematic view of stacking and laminating a plurality of first PCB substrates in accordance with another preferred embodiment of the present invention.

In FIG. 9, at least two first PCB substrates 10 obtained by carrying out the steps (a) to (d) of the manufacturing process can be stacked and laminated corresponding to the large cross-section circuit (wherein at least one prepreg 14 can be added between the two first PCB substrates 10 to stack and laminate the plurality of first PCB substrates 10), and at least one conductor is installed between the first PCB substrates for connecting predetermined circuits to form a multi-layer PCB, and the prepreg 30 included between the two first PCB substrates 10 can be used for directly covering the exposed large cross-section circuit.

Figure 10A:
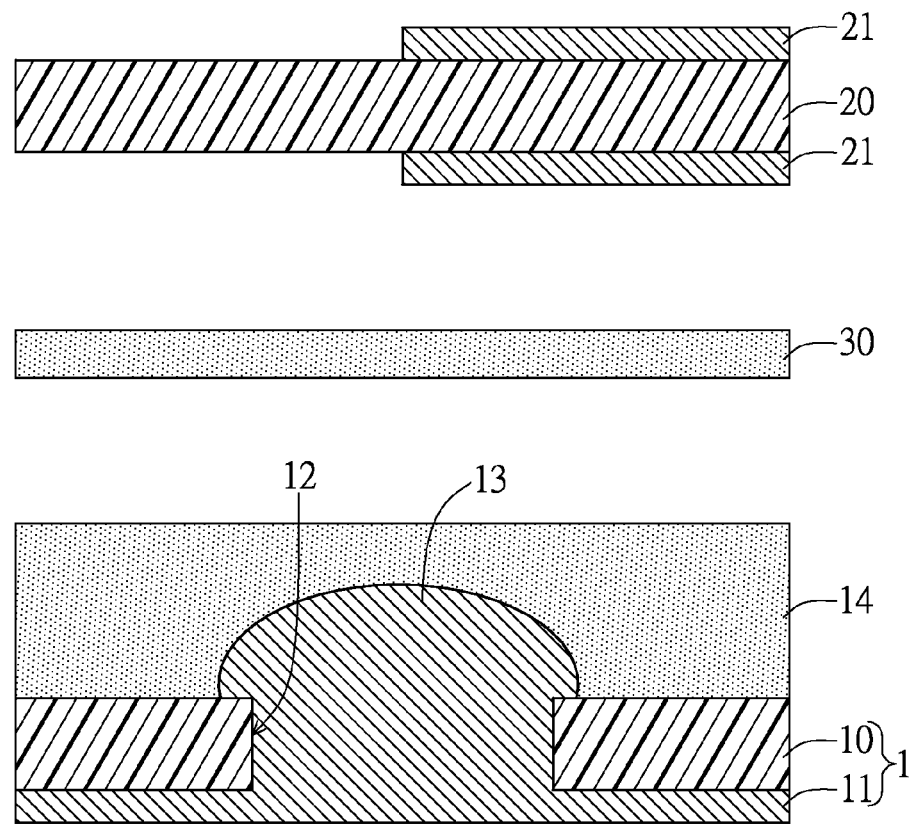
FIG. 10A is a schematic view of stacking and laminating a first PCB substrate and a second PCB substrate of the present invention.
Figure 10B:
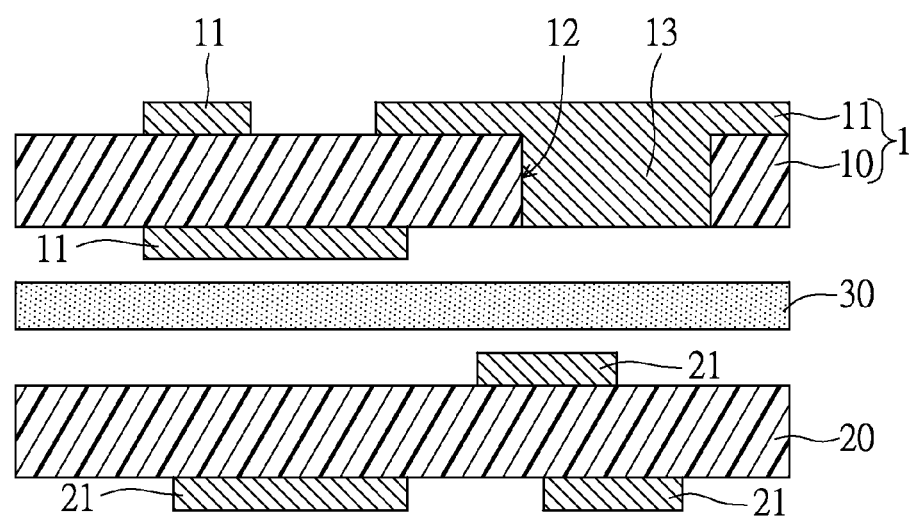
FIG. 10B is a schematic view of stacking and laminating a first PCB substrate and a second PCB substrate shown in FIG. 4G of the present invention.
Figure 11A:
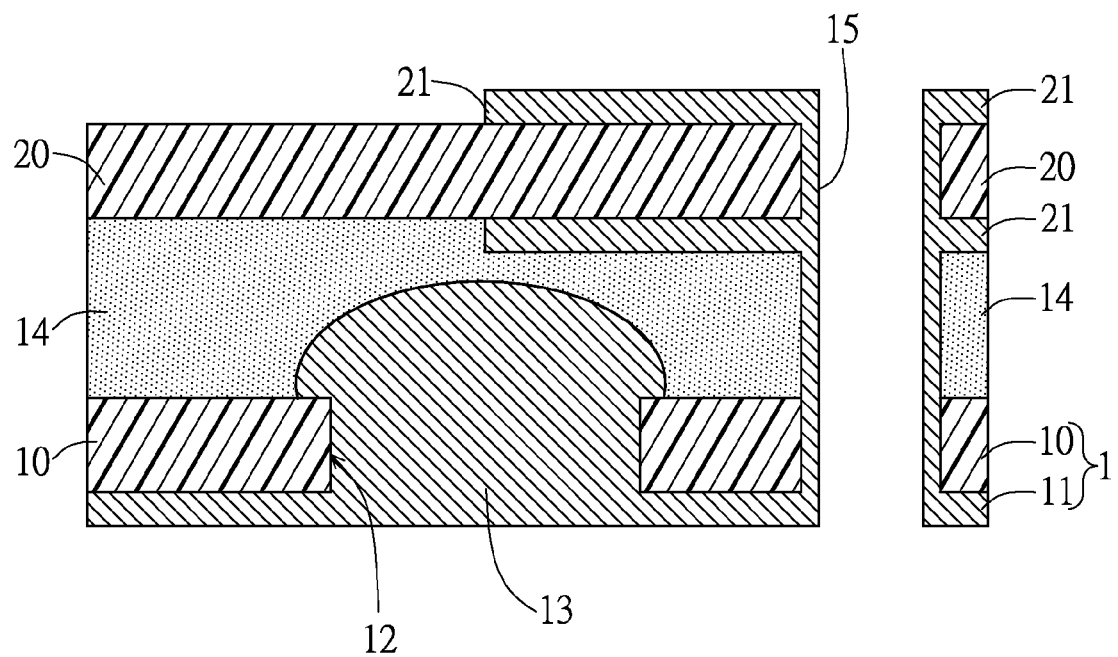
FIG. 11A is a cross-sectional view of a plurality of stacked and laminated a first PCB substrate and a second PCB substrate of the present invention.
Figure 11B:
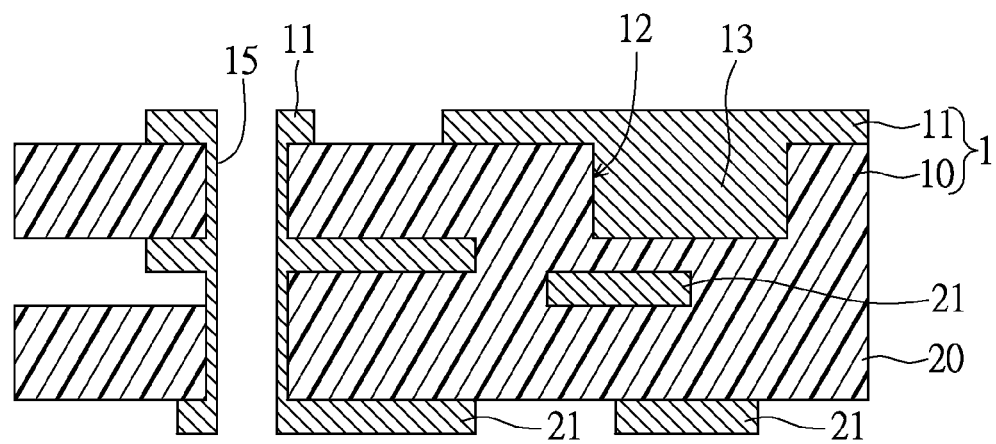
FIG. 11B is a cross-sectional view of a plurality of stacked and laminated a first PCB substrate and a second PCB substrate shown in FIG. 4G of the present invention.

In a multilayer PCB manufactured in accordance with the present invention as shown in FIG. 10A or FIG. 10B, at least one second PCB substrate 20 having at least one copper clad circuit layer 21 is provided, and at least one first PCB substrate 10 is stacked and laminated with the at least one second PCB substrate 20 (wherein the prepreg 30 is used for stacking and laminating the at least one first PCB substrate 10 and the at least one second PCB substrate 20 as shown in the figure). In FIG. 11A or FIG. 11B, at least one conductor 15 is installed between the at least one first PCB 10 and the at least one second PCB substrate 20 for coupling predetermined circuits, so as to achieve the effect of increasing the circuit layout density.

Figure 12:
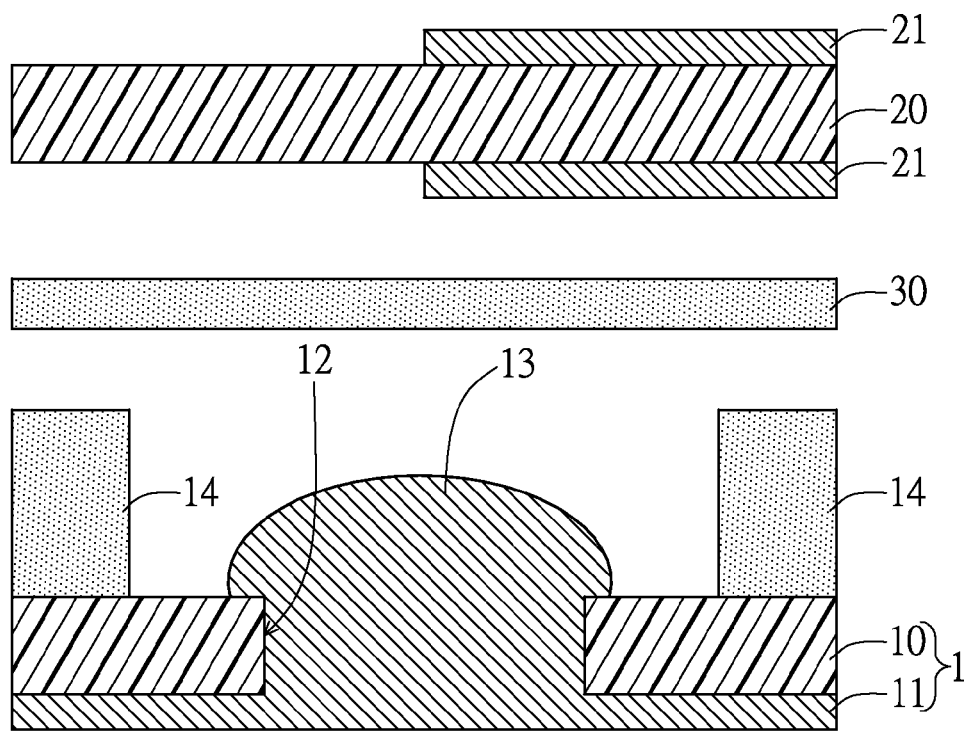
FIG. 12 is a schematic view of stacking and laminating a first PCB substrate and a second PCB substrate in accordance with another preferred embodiment of the present invention.

In FIG. 12, at least one second PCB substrate 20 having at least one copper clad circuit layer 21 is provided, and at least one first PCB substrate 10 obtained from the steps (a) to (d) of the manufacturing process is stacked and laminated with at least one second PCB substrate 20, wherein the large cross-section circuit is corresponding to the second PCB substrate 20 (and at least one prepreg 30 is additionally installed between the first PCB substrate 10 and the second PCB substrate 20 for stacking and laminating the at least one first PCB substrate 10 and the at least one second PCB substrate 20), and at least one conductor is installed between the at least one first PCB substrate 10 and the at least one second PCB substrate 20 for coupling predetermined circuits to form a multi-layer PCB, and the prepreg 30 included between the two first PCB substrates 10 can be used for directly covering the exposed large cross-section circuit.

Figure 13:
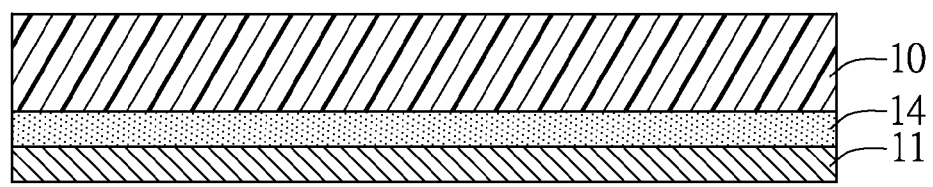
FIG. 13 is a cross-sectional view of a forming a copper clad circuit layer on a board surface of a first PCB substrate by a laminating method of the present invention.

Since the large cross-section circuit with a thickness greater than that of the copper clad circuit layer 11 is hidden inside the board, a large quantity of the filling of the prepreg is no longer required for laminating a plurality of boards during the manufacture of a multilayer PCB. The issues of slippery boards and bubbles caused by excessive or insufficient resin, and a large quantity of resin flowing into the gaps of the thick copper circuit can be overcome to improve the reliability or conductive anodic filament (CAF) problem due to the direct contact of the fiberglass with the copper clad layer. In other words, the first PCB substrate 10 of the present invention has the copper clad circuit layer 11 formed on the board surface of the first PCB substrate 10 by a copper plating method or by a laminating method (as shown in FIG. 13 wherein the copper clad circuit layer 11 is fixed onto the first PCB substrate 10 in the prepreg 30) in order to obtain high quality and reliability of the circuits.

Figure 14:
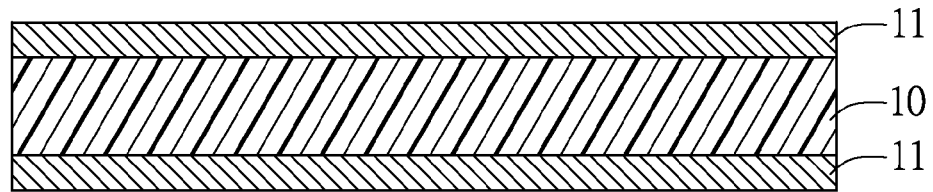
FIG. 14 is a cross-sectional view of a first PCB substrate used in another preferred embodiment of the present invention.

It is noteworthy that the first PCB substrate 10 used in a preferred embodiment of the present invention can be the one as shown in FIG. 14, wherein both board surfaces have a copper clad circuit layer 11, so that the PCB manufactured by the method of the present invention is a PCB with a plurality of copper clad circuit layers 11 to increase the circuit layout density.

Regardless of whether the design is with a copper clad circuit layer 11 on a single side the first PCB substrate 10 or two copper clad circuit layers 11 on both sides of the first PCB substrate 10 respectively, a shielding layer is coated onto a surface of the copper clad circuit layer 11 after the first PCB substrate 10 processed as described in step (b) is completed, and then the thick copper circuit 13 is filled into the circuit trench 12 by a copper electroplating method, and the shielding layer on the surface of the copper clad circuit layer 11 is removed after step (c) ends, so that the copper clad circuit layer 11 can be protected from increasing in thickness which may be caused by the coating of the electroplated metal in the process of filling the thick copper circuit 13.

Please refer to FIG. 15 through FIG. 23, which show a second embodiment of the instant disclosure. The identical features of the two embodiments are not disclosed again, and the manufacturing method of the printed circuit board of the instant embodiment includes the steps as follows.

Figure 15:
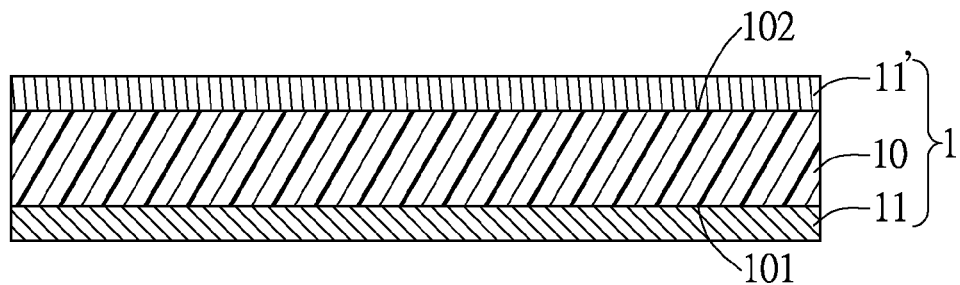
FIG. 15 is a cross-sectional view of step S101 of a second embodiment of the present invention.

As shown in FIG. 15 (S101), a board 1 is provided, and the board 1 includes a first PCB substrate 10 and two copper clad circuit layers 11,11'. The first PCB substrate 10 has a first board surface 101 and an opposite second board surface 102. The two copper clad circuit layers 11, 11' are respectively disposed on the first board surface 101 and the second board surface 102 of the first PCB substrate 10. A thickness of each one of the copper clad circuit layers 11, 11' is smaller than a distance between the first board surface 101 and the second board surface 102. In other words, the thickness of each one of the copper clad circuit layers 11, 11' is smaller than a thickness of the first PCB substrate 10.

Figure 16:
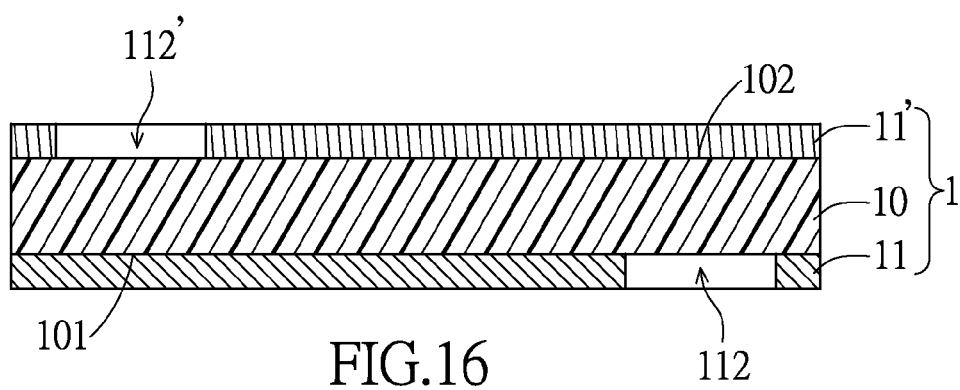
FIG. 16 is a cross-sectional view of step S102 of the second embodiment of the present invention.

As shown in FIG. 16 (S102), the two copper clad circuit layers 11, 11' are respectively formed with two elongated openings 112, 112'. Specifically, a Lithography manner and an etching manner are adapted to remove part of the copper clad circuit layer 11 so as to form the opening 112 and to remove part of the copper clad circuit layer 11' so as to form the opening 112'. Accordingly, part of the first board surface 101 and part of the second board surface 102 are respectively exposed from the two copper clad circuit layers 11, 11' via the two openings 112, 112'.

Figure 17:
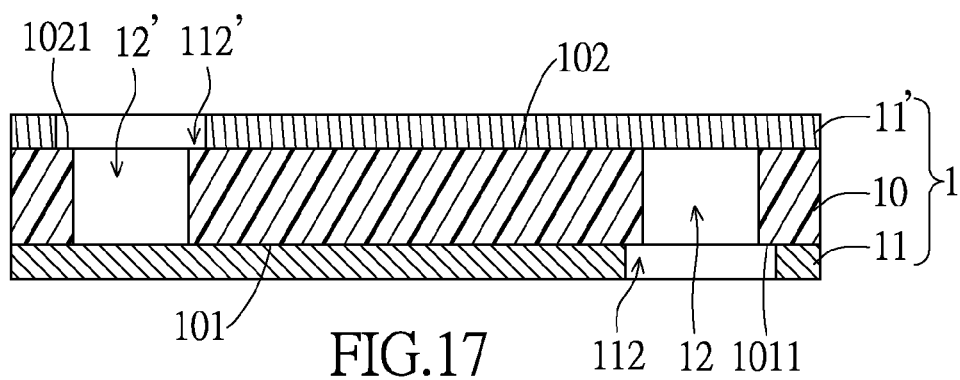
FIG. 17 is a cross-sectional view of step S103 of the second embodiment of the present invention.

As shown in FIG. 17 (S103), the part of the first board surface 101 and the part of the second board surface 102, which are respectively exposed from the two copper clad circuit layers 11, 11' via the two openings 112, 112', are respectively formed with two elongated circuit trenches 12, 12' by using a non-chemical etching manner. A width of each one of the circuit trenches 12, 12' is smaller than or identical to a width of the corresponding opening 112, 112'. Each one of the circuit trenches 12, 12' has a length greater than a depth thereof, and the length of each one of the circuit trenches 12, 12' is approximately identical to a length of the corresponding opening 112, 112'. In other words, at a position of the opening 112, the circuit trench 12 is concavely formed on the first board surface 101 of the first PCB substrate 10 to expose part of the copper clad circuit layer 11'; at a position of the opening 112', the circuit trench 12' is concavely formed on the second board surface 102 of the first PCB substrate 10 to expose part of the copper clad circuit layer 11.

Moreover, the first board surface 101 of the first PCB substrate 10 defines a first reserved region 1011, which is a portion of the first board surface 101 arranged between a side wall of the circuit trench 12 and a wall defining the opening 112. In other words, the copper clad circuit layer 11 does not cover all of the first board surface 101, and a non-covered region of the first board surface 101 between the side wall of the circuit trench 12 and the wall defining the opening 112 is defined as the first reserved region 1011. The second board surface 102 of the first PCB substrate 10 defines a second reserved region 1021, which is a portion of the second board surface 102 arranged between a side wall of the circuit trench 12' and a wall defining the opening 112'. In other words, the copper clad circuit layer 11' does not cover all of the second board surface 102, and a non-covered region of the second board surface 102 between the side wall of the circuit trench 12' and the wall defining the opening 112' is defined as the second reserved region 1021.

Figure 18:
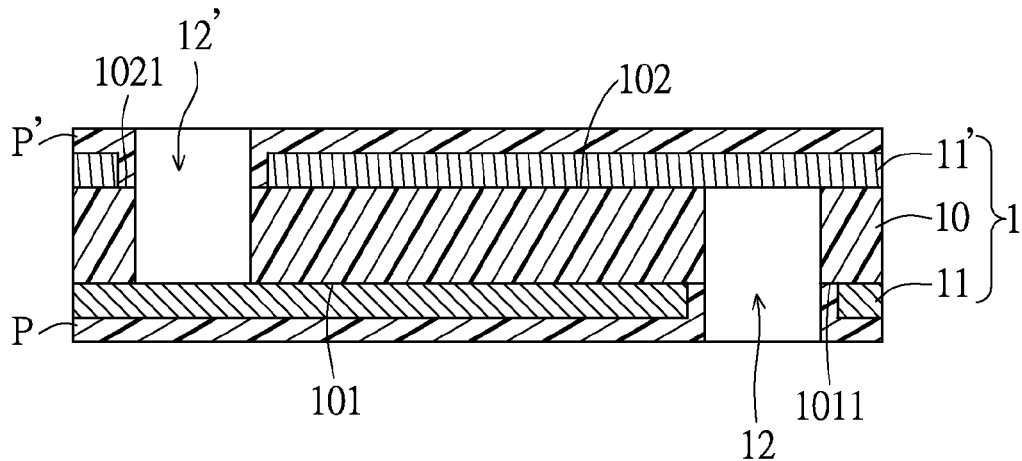
FIG. 18 is a cross-sectional view of step S104 of the second embodiment of the present invention.

As shown in FIG. 18 (S104), a shielding layer P is formed on the copper clad circuit layer 11 and the first reserved region 1011 to expose the circuit trench 12, and a shielding layer P' is formed on the copper clad circuit layer 11' and the second reserved region 1021 to expose the circuit trench 12'. Specifically, each one of the two shielding layers P, P' can be anti-plating dry film, photo resist, or other insulating material. The two shielding layers P, P' do not cover the exposed parts of the copper clad circuit layers 11, 11', which are exposed from the circuit trenches 12, 12'.

Figure 19:
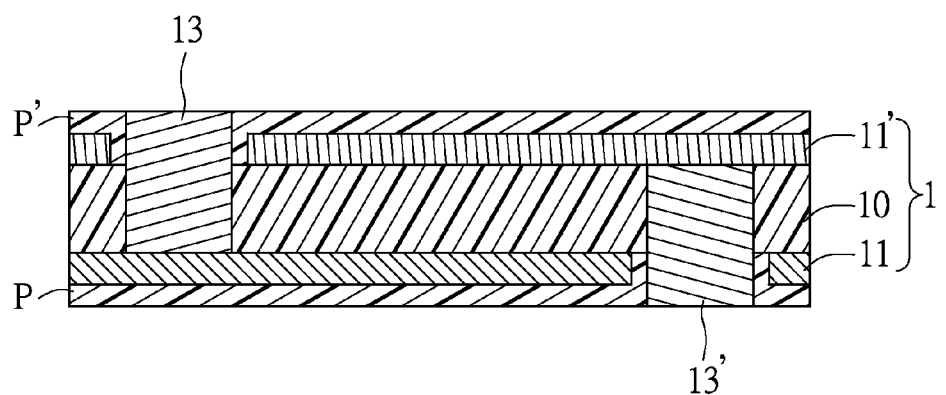
FIG. 19 is a cross-sectional view of step S105 of the second embodiment of the present invention.

As shown in FIG. 19 (S105), two thick copper circuits 13, 13' are respectively formed in the circuit trenches 12, 12' by using a plating manner. Specifically, a plating manner is adapted to fill copper material into the two circuit tranches 12, 12' so as to form the solid thick copper circuits 13, 13'. If the printed circuit board 100 is prepared without any reserved region 1011, 1021, metallic ions (e.g., copper ions) are easily gathered at edges of the copper clad circuit layers 11, 11' (e.g., the walls defining the openings 112, 112') to form a plurality of nodules (e.g., copper nodules).

However, the instant embodiment uses the shielding layers P, P' to cover the copper clad circuit layers 11, 11' and the first and second reserved regions 1011, 1021, thereby preventing metallic ions from gathering at edges of the copper clad circuit layers 11, 11'. Accordingly, the thick copper circuits 13, 13' can be prepared by using the plating manner without forming any copper nodules. In addition, the two shielding layers P, P' respectively cover the outer surfaces of the two copper clad circuit layers 11, 11' to prevent metallic ions from adhering on the copper clad circuit layers 11, 11'.

Figure 20:
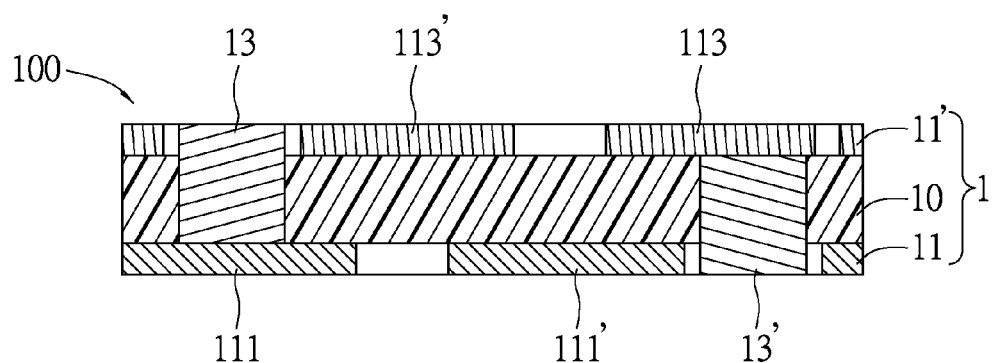
FIG. 20 is a cross-sectional view of step S106 of the second embodiment of the present invention.

As shown in FIG. 20 (S106), the two shielding layers P, P' are removed, and the shielding layers P, P' can be removed by using an aqueous solution containing sodium hydroxide.

The copper clad circuit layer 11 is etched to form two first circuits 111, 111', and the first circuit 111 is integrally connected to the thick copper circuit 13. The first circuit 111 and the thick copper circuit 13 are defined as a thick circuit, and the first circuit 111' is defined as a thin circuit. Moreover, the copper clad circuit layer 11' is etched to form two second circuits 113, 113', and the second circuit 113 is integrally connected to the thick copper circuit 13'. The second circuit 113 and the thick copper circuit 13' are defined as a thick circuit, and the second circuit 113' is defined as a thin circuit.

A length of each thick copper circuit 13, 13' connected to the corresponding first circuit 111 or the corresponding second circuit 113 is at least 10% of a length of the thick circuit, thus at least 10% of each thick circuit has a large thickness, which is identical to the thickness of the first PCB substrate 10 and one of the copper clad circuit layers 11, 11'. In addition, the length of part of the first circuit 111 or the second circuit 113, which is connected to the corresponding thick copper circuit 13, 13', is preferably 10~40% of the total length of the thick circuit, but is not limited thereto.

Moreover, the printed circuit board 100 of the instant embodiment can be prepared with a polishing process for the thick copper circuits 13, 13'. Specifically, the top end of each one of the thick copper circuits 13, 13' can be polished by using a polishing machine to form a flat surface (as shown in FIG. 20). Each one of the thick copper circuits 13, 13' can be prepared with different height, that is to say, the top end of each one of the thick copper circuits 13, 13' can be coplanar with or lower than the corresponding copper clad circuit layer 11, 11'. In the instant embodiment, the top end of each one of the thick copper circuits 13, 13' is polished by using a polishing machine to be coplanar with the corresponding copper clad circuit layer 11, 11'.

The manufacturing method in the instant embodiment can manufacture a printed circuit board 100 after implementing the above steps S101~S106, and the printed circuit board 100 is provided with circuits of at least two different thicknesses (i.e., different cross-sectional areas). In practical use, the thin circuit of the printed circuit board 100 is configured to transmit a digital signal, and the thick circuit of the printed circuit board 100 is configured to transmit a high power driving current for reducing the impedance corresponding to the driving current, thereby preventing circuit damage or overheating from occurring to the printed circuit board 100.

Figure 21:
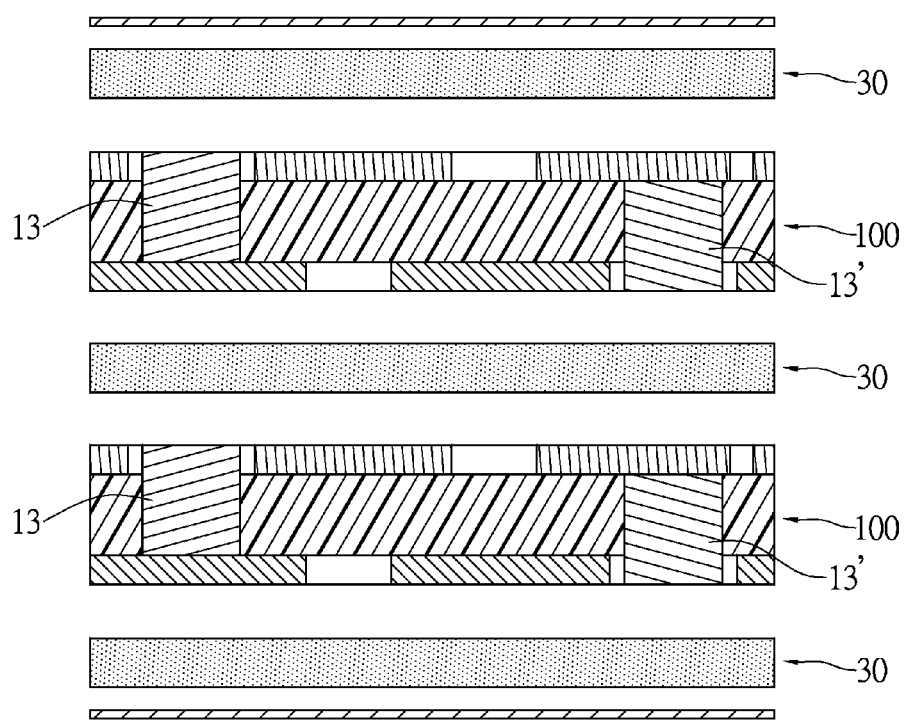
FIG. 21 is a cross-sectional view of step S107 of the second embodiment of the present invention.

In addition, after the step S106, the manufacturing method in the instant embodiment can further comprise the following steps:

As shown in FIG. 21 (S107), two printed circuit boards 100 are stacked by arranging a prepreg there-between. Specifically, at least part of the thick copper circuit 13 of one of the two printed circuit boards 100 is overlapping at least part of the thick copper circuit 13 of another printed circuit board 100, and at least part of the thick copper circuit 13' of one of the two printed circuit boards 100 is overlapping at least part of the thick copper circuit 13' of another printed circuit board 100.

Figure 22:
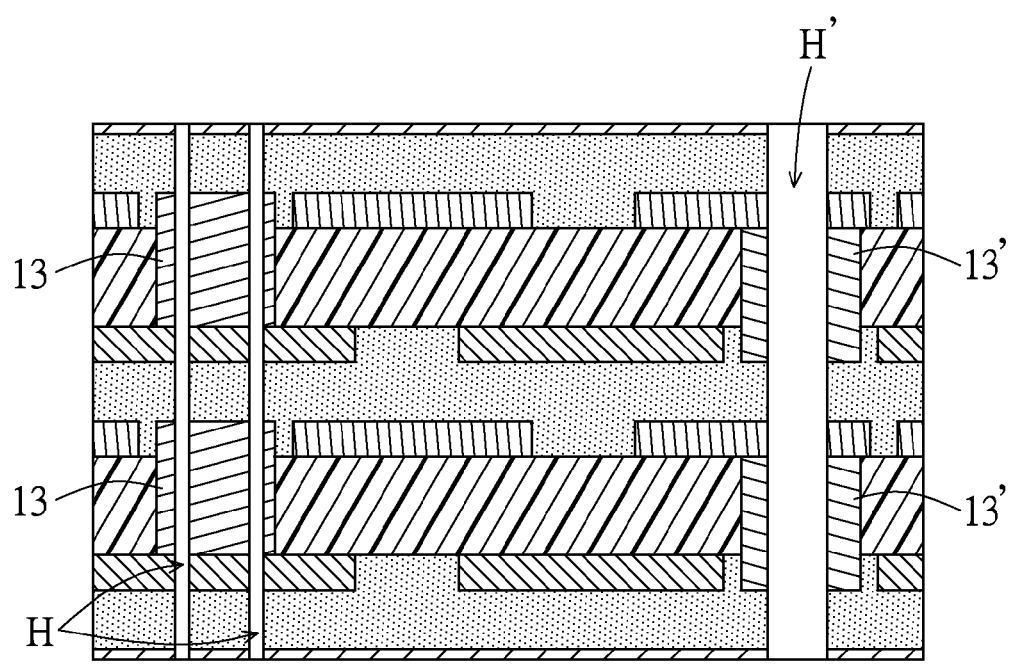
FIG. 22 is a cross-sectional view of step S108 of the second embodiment of the present invention.

As shown in FIG. 22 (S108), a thru-hole H is formed by penetrating through the parts of the thick copper circuits 13 of the two printed circuit boards 100, and a thru-hole H' is formed by penetrating through the parts of the thick copper circuits 13' of the two printed circuit boards 100.

Figure 23:
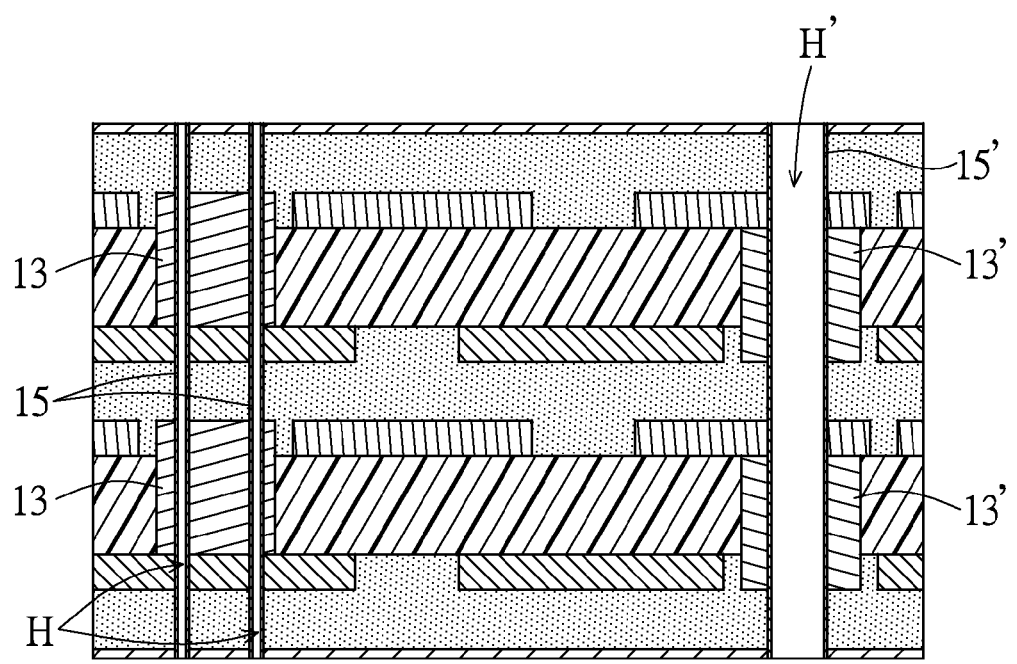
FIG. 23 is a cross-sectional view of step S109 of the second embodiment of the present invention.

As shown in FIG. 23 (S109), a conductor 15 is plated on a wall defining the thru-hole H for electrically connecting the two thick copper circuits 13, and a conductor 15' is plated on a wall defining the thru-hole H' for electrically connecting the two thick copper circuits 13'.

[The Possible Effect of the Instant Disclosure]

Compared with the prior art, the printed circuit board and the manufacturing method thereof disclosed in the present invention has the following advantages:

1. In the first PCB substrate of the basic structure of the circuit with the copper clad circuit layer of a smaller thickness, at least one circuit (i.e., thick copper circuit) with a thickness greater than that of the copper clad circuit layer is manufactured to save the material costs.

2. Additional manufacturing technology is applied to build the circuit having a circuit with a thickness greater than that of the copper clad circuit layer on the first PCB substrate, so as to effectively avoid wasting the high priced metal.

3. Additional manufacturing technology is applied to build the circuit having a circuit with a thickness greater than that of the copper clad circuit layer on the first PCB substrate, and the manufacture does not require repeated etching operations, so that the pollution sources can be minimized.

4. Since the large cross-section circuit is hidden inside the printed circuit board, when a multiple of layers are laminated, the process no longer requires a large quantity of filling of the prepreg, so that the issues of sliding boards or bubbles caused by excessive or insufficient flow will not easily occur during the lamination process, or a large quantity of resin flowing into the gaps of the thick copper circuit to give rise to the issues of reliability or CAF caused by the direct contact of the copper clad layer.

5. Since the large cross-section circuit is hidden inside the printed circuit board, the problem of having a height difference will not be so serious, so as to make it difficult to cover a solder mask or print texts.

6. The instant disclosure uses the shielding layers to cover the copper clad circuit layers and the first and second reserved regions, thereby preventing metallic ions from gathering at edges of the copper clad circuit layers. Accordingly, the thick copper circuits can be prepared by using the plating manner without forming any copper nodules.

In summation of the description above, the present invention provides a feasible printed circuit board manufacturing method, improves over the prior art, and complies with the patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A manufacturing method of a printed circuit board, comprising:
   providing a board, wherein the board includes a first PCB substrate and a copper clad circuit layer, the first PCB substrate has a first board surface and an opposite second board surface, the copper clad circuit layer is disposed on the first board surface, and a thickness of the copper clad circuit layer is smaller than a distance between the first and second board surfaces;
   non-chemically etching the second board surface of the first PCB substrate to form an elongated circuit trench until part of the copper clad circuit layer is exposed from the second board surface via the circuit trench, wherein a length of the circuit trench is larger than a depth of the circuit trench and is perpendicular to the distance between the first and second board surfaces;
   forming a copper circuit in the circuit trench by a plating manner, a thickness of the copper circuit being greater than or identical to the distance between the first and second board surfaces; and
   etching the copper clad circuit layer to form two separated first circuits, wherein the copper circuit and one of the first circuits are in an integral connection and are defined as a thick circuit, and another one of the first circuits is defined as a thin circuit, wherein the length of the circuit trench is at least 10% of a length of the thick circuit.

2. The manufacturing method as claimed in claim 1, wherein in the forming of the circuit trench, a length of the circuit trench is greater than the distance between the first and second board surfaces.

3. The manufacturing method as claimed in claim 1, wherein the length of the copper circuit connected to the corresponding first circuit is 10~40% of the length of the thick circuit.

4. A manufacturing method of a printed circuit board, comprising:
   providing a board, wherein the board includes a first PCB substrate and two copper clad circuit layers, the first PCB substrate has a first board surface and an opposite second board surface, the copper clad circuit layers are respectively disposed on the first and second board surfaces, and a thickness of each copper clad circuit layer is smaller than a distance between the first and second board surfaces;
   forming an elongated opening on the copper clad circuit layer disposed on the second board surface;
   non-chemically etching a portion of the second board surface of the first PCB substrate exposed from the corresponding copper clad circuit layer via the opening to form an elongated circuit trench until part of the copper clad circuit layer disposed on the first board surface is exposed from the second board surface via the circuit trench, wherein a width of the circuit trench is smaller than a width of the opening, a region between a wall defining the opening and a side wall of the circuit trench is defined as a first reserved region;
   forming two shielding layers onto the two copper clad circuit layers and the first reserved region to expose the circuit trench;
   forming a copper circuit in the circuit trench by a plating manner, a thickness of the copper circuit being greater than or identical to the distance between the first and second board surfaces;
   removing the two shielding layers; and
   etching the copper clad circuit layer arranged on the first board surface to form two separated first circuits, wherein the copper circuit and one of the first circuits are in an integral connection and are defined as a thick circuit, and another one of the first circuits is defined as a thin circuit, wherein a length of the circuit trench is at least 10% of a length of the thick circuit.

5. The manufacturing method as claimed in claim 4, wherein in the forming of the circuit trench, a length of the circuit trench is greater than the distance between the first and second board surfaces, and the length of the circuit trench is substantially identical to a length of the opening.

6. The manufacturing method as claimed in claim 4, wherein the length of the copper circuit connected to the corresponding first circuit is 10~40% of the length of the thick circuit.

7. The manufacturing method as claimed in claim 4, further comprising:
- providing two printed circuit boards each prepared by the manufacturing method as claimed in claim 4;
- disposing a prepreg between the two printed circuit boards and laminating the two printed circuit boards and the prepreg, at least part of the thick copper circuit of one of the two printed circuit boards overlapping at least part of the thick copper circuit of another printed circuit board;
- forming a thru-hole penetrating through the parts of the thick copper circuits of the two printed circuit boards; and
- plating a conductor on a wall defining the thru-hole for electrically connecting the two thick copper circuits.

* * * * *